(12) United States Patent
Park

(10) Patent No.: US 7,566,660 B2
(45) Date of Patent: Jul. 28, 2009

(54) SEMICONDUCTOR DEVICE AND METHOD FOR MANUFACTURING THE SAME

(75) Inventor: Keun Soo Park, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 136 days.

(21) Appl. No.: 11/641,792

(22) Filed: Dec. 20, 2006

(65) Prior Publication Data

US 2007/0148801 A1 Jun. 28, 2007

(30) Foreign Application Priority Data

Dec. 28, 2005 (KR) .................. 10-2005-0132009

(51) Int. Cl.
*H01L 21/44* (2006.01)
*H01L 21/469* (2006.01)

(52) U.S. Cl. .............. 438/673; 438/954; 438/761; 438/706; 438/763; 438/924; 257/E21.21; 257/E21.423

(58) Field of Classification Search ............ 257/E21.21, 257/E21.423
See application file for complete search history.

(56) References Cited

U.S. PATENT DOCUMENTS

| | | | | |
|---|---|---|---|---|
| 5,880,019 A | * | 3/1999 | Hsieh et al. | 438/666 |
| 5,994,232 A | * | 11/1999 | Clampitt | 438/706 |
| 6,593,186 B1 | * | 7/2003 | Kitamura et al. | 438/257 |
| 2005/0142801 A1 | * | 6/2005 | Lee | 438/424 |
| 2007/0102736 A1 | * | 5/2007 | Chuang et al. | 257/290 |

FOREIGN PATENT DOCUMENTS

JP 06-31654 * 4/1994

OTHER PUBLICATIONS

English machine translation of cited JP 06-310654 retrieved from PAJ. 5 pages.*

* cited by examiner

*Primary Examiner*—Walter L Lindsay, Jr.
*Assistant Examiner*—Mohsen Ahmadi
(74) *Attorney, Agent, or Firm*—Lowe Hauptman Ham & Berner, LLP

(57) ABSTRACT

A method for manufacturing a semiconductor device includes the steps of: forming a gate on a semiconductor substrate; sequentially stacking a first oxide layer, a nitride layer and a second oxide layer on the semiconductor substrate including the gate; forming a first photoresist layer pattern on the second oxide layer; forming a second oxide layer pattern by wet etching the second oxide layer by using the first photoresist layer pattern as a mask; forming a nitride layer pattern by dry etching the nitride layer using the second oxide layer pattern as a mask; and forming a first oxide layer pattern by etching the first oxide layer using the nitride layer pattern as a mask.

14 Claims, 7 Drawing Sheets

SEMICONDUCTOR DEVICE AND METHOD FOR MANUFACTURING THE SAME

FIELD OF THE INVENTION

The present invention relates to a method for manufacturing a semiconductor device a method for manufacturing the same; and, more particularly to a method for removing a polymer in a semiconductor device and a semiconductor device manufactured by using the same.

BACKGROUND OF THE INVENTION

Generally, in a process for forming an LDI (LCD Drive IC), a gate is formed, and a layer having an ONO (Oxide, Nitride, Oxide) structure is formed on the gate. Thereafter, the ONO layer is then selectively etched by performing patterning, and a cleaning process is performed.

However, according to a prior art as set forth above, membranes of the ONO layer are separated during the process of etching the ONO layer; and thus, it causes a problem to produce undesired polymers. Hereinafter, problems induced in a method for fabricating a semiconductor device according to the prior art will be schematically described with reference to drawings.

FIG. 1A to FIG. 1F are process cross-sectional views illustrating a method for manufacturing a semiconductor device according to the prior art. First, as shown in FIG. 1A, a gate 4 is formed on a semiconductor substrate 2; and, as shown in FIG. 1B, a first oxide layer 6, a nitride layer 8 and a second oxide layer 10 are sequentially formed on the semiconductor substrate 2 including the gate 4.

Thereafter, as shown in FIG. 1C, a first photoresist layer pattern 12 is formed on the second oxide layer 10 for patterning the second oxide layer 10. As shown in FIG. 1D, the second oxide layer 10 is selectively etched through a dry etching process by using the first photoresist pattern 12 as a mask. In addition the first photoresist layer pattern 12 is removed. During the etching process, a first polymer 14 is generated on the nitride layer 8 at both sides of the second oxide layer 12.

Because an etching process, e.g., a drying etching, is applied to the nitride layer 8 without removing the first polymer 14, the first polymer 14 serves as an additional mask. That is, as shown in FIG. 1E, the nitride layer 8 is selectively etched by using both the first polymer 14 and the second oxide layer 10a as masks. At this time, since the nitride layer 8 is also etched by using a dry etching process, a second polymer 15 is additionally generated on the first oxide layer 6 at both sides of the nitride layer 8, similarly to the etching process of the second oxide layer 10.

And, since the etching process of the first oxide layer 6 is also, in the prior art, applied without removing the second polymer 15, as shown in FIG. 1F, the first oxide layer 6 is selectively etched by using both the second polymer 15 and the nitride layer 8a as masks. During this time, because the first oxide layer 6 is etched by using a wet etching process, polymers are not generated at both sides of the first oxide layer 6.

Polymers 14 and 15 generated through such processes are separated and lifted from the second oxide layer 10a and the nitride layer 8a during the following heating process. In FIG. 2, photographs of such lifted polymers are shown. The lifted polymers adhere to a device such as a chamber and therefore cause semiconductor equipment to be contaminated thereby.

Accordingly, it is difficult to secure a margin between the ONO layer and the gate since a critical dimension (CD) is hard to control due to the polymers generated during the etching process of the ONO layer. Furthermore, there occurs a contamination of the semiconductor equipment due to the lifted polymers.

SUMMARY OF THE INVENTION

Therefore, it is an object of the present invention to provide a method for manufacturing a semiconductor device capable of preventing polymers from generating or removing the generated polymers by mixing a dry etching and a wet etching in a process of etching an ONO layer.

In accordance with a preferred embodiment of the present invention, there is provided a method for manufacturing a semiconductor device, the method including the steps of: forming a gate on a semiconductor substrate; sequentially stacking a first oxide layer, a nitride layer and a second oxide layer on the semiconductor substrate including the gate; forming a first photoresist layer pattern on the second oxide layer; forming a second oxide layer pattern by wet etching the second oxide layer by using the first photoresist layer pattern as a mask; forming a nitride layer pattern by dry etching the nitride layer by using the second oxide layer pattern as a mask; and forming a first oxide layer pattern by etching the first oxide layer by using the nitride layer pattern as a mask.

In accordance with another embodiment of the present invention, there is provided a method for manufacturing a semiconductor device, the method comprising the steps of: forming a gate on a semiconductor substrate; sequentially stacking a first oxide layer, a nitride layer and a second oxide layer on the semiconductor substrate including the gate; forming a first photoresist layer pattern on the second oxide layer; forming a second oxide layer pattern by selectively etching the second oxide layer by using the first photoresist layer pattern as a mask and removing the first photoresist layer pattern; forming a nitride layer pattern by wet etching the nitride layer by using the second oxide layer pattern as a mask; and forming a first oxide layer pattern by selectively etching the first oxide layer by using the nitride layer pattern as a mask.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Hereinafter, preferred embodiments of the present invention will be described in detail with reference to the accompanying drawings so that they can be readily implemented by those skilled in the art.

Referring to FIG. 3A to FIG. 3H, there are illustrated process cross-sectional views illustrating a method for manufacturing a semiconductor device according to one embodiment of the present invention.

Figure 1A:
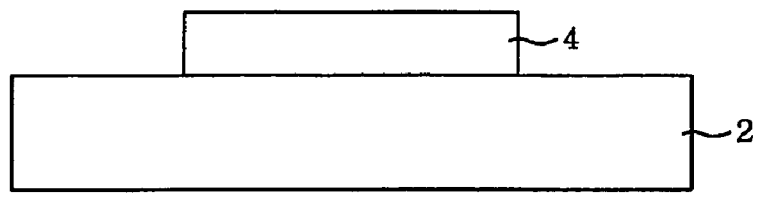
FIG. 1A to FIG. 1F are process cross-sectional views illustrating a method for manufacturing a semiconductor device according to a prior art.
Figure 1B:
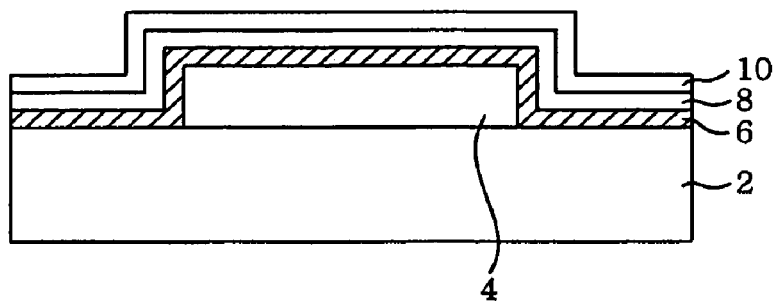
Figure 1C:
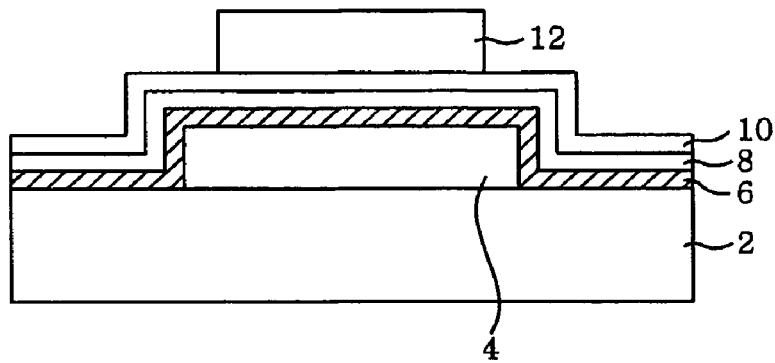
Figure 1D:
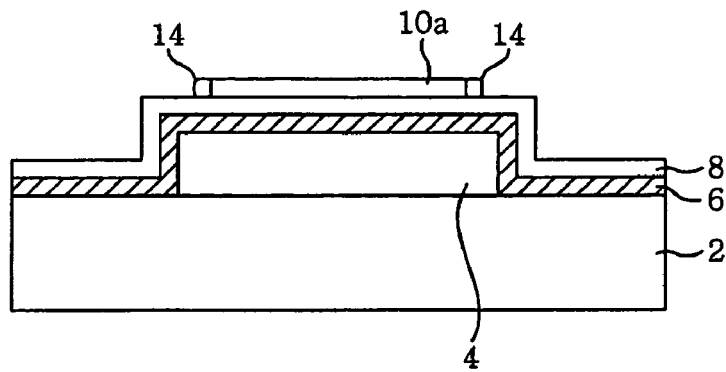
Figure 1E:
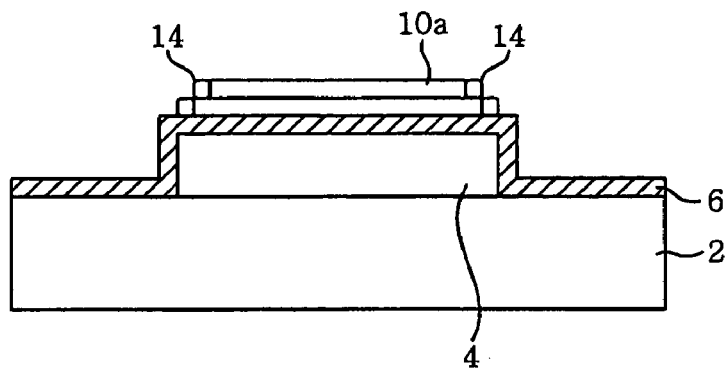
Figure 1F:
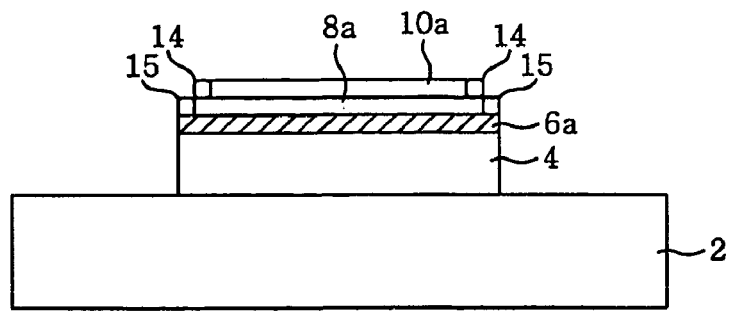
Figure 2:
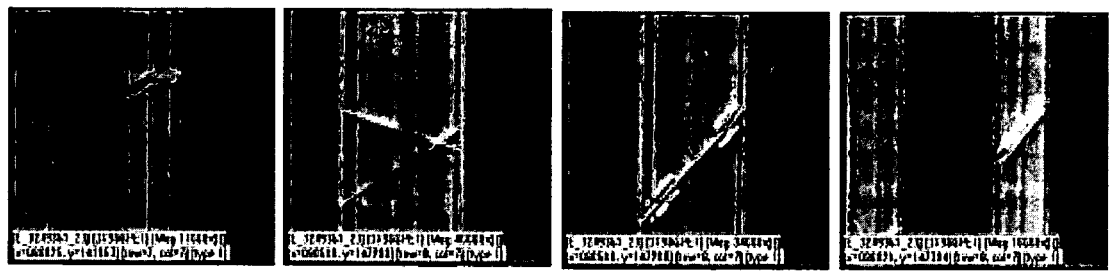
FIG. 2 illustates a photograph of polymers generated at a semiconductor device.
Figure 3A:
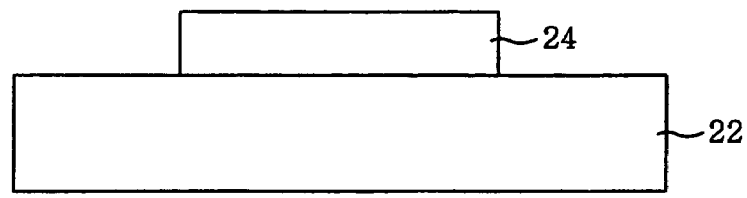
FIG. 3A to FIG. 3H are process cross-sectional views illustrating a method for manufacturing a semiconductor device in accordance with one embodiment of the present invention.
Figure 3B:
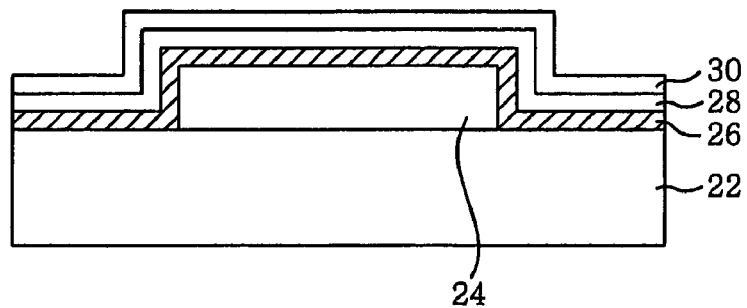

First, as shown in FIG. 3A, a gate 24 is formed on a semiconductor substrate 22. As shown in FIG. 3B, a first oxide layer 26, a nitride layer 28 and a second oxide layer 30 are sequentially formed on the semiconductor substrate including the gate.

Figure 3C:
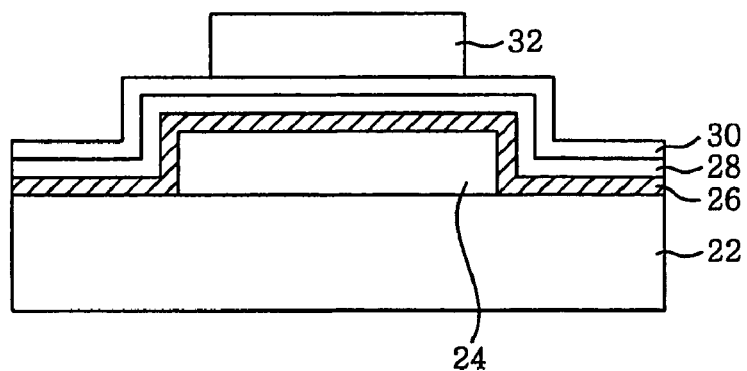
Figure 3D:
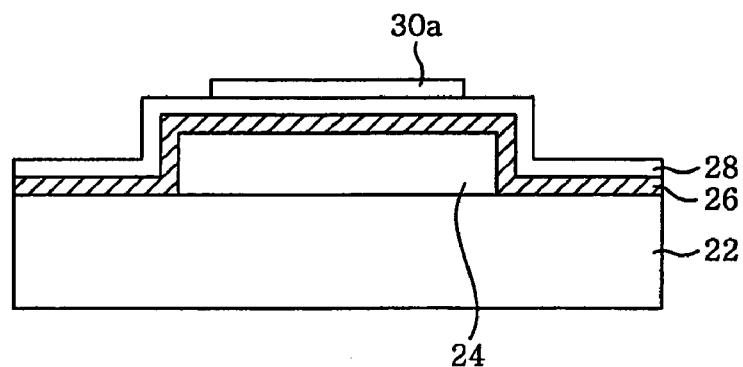

Thereafter, as shown in FIG. 3C, the first photoresist layer pattern 32 is coated on the second oxide layer 30 for patterning the second oxide layer 30. And as shown in FIG. 3D, the second oxide layer 30 is selectively wet etched by using the first photoresist layer pattern 32 as a mask and the first photoresist layer 32 is removed. As described above, in the present invention, the second oxide layer 30 is etched by using a wet etching process, and therefore, polymers are not generated during the etching process.

Figure 3E:
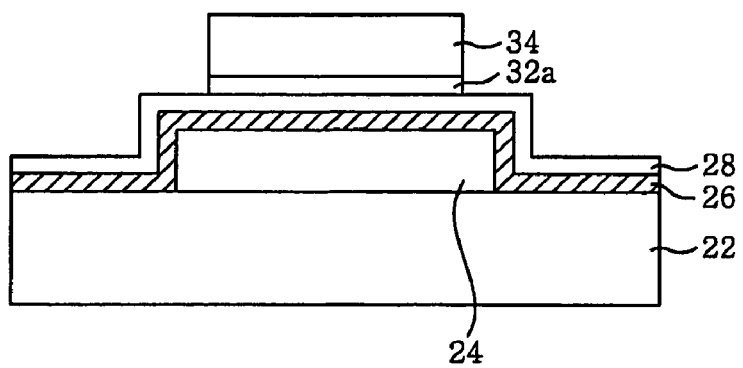

As set forth above, since the second oxide layer 30 is etched by using a wet etching process, a resultant pattern from the wet etching cannot be preserved as it is. Therefore, before etching the nitride layer 28, it is preferable that the nitride layer 28 is etched by using the second photoresist layer pattern 34 as a mask after forming the second photoresist layer pattern 34 on the second oxide layer pattern 30a, as shown in FIG. 3E.

Figure 3F:
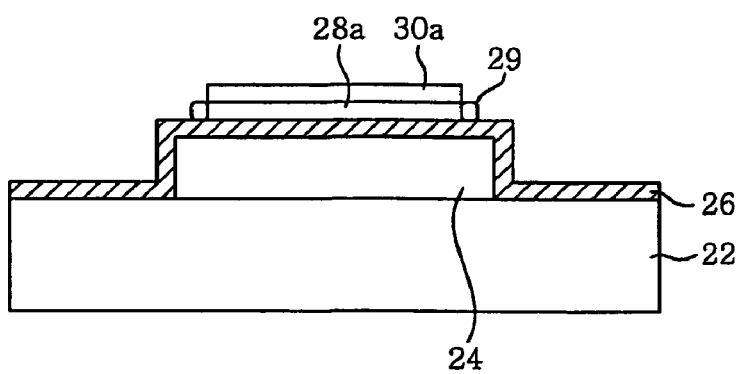
Figure 3G:
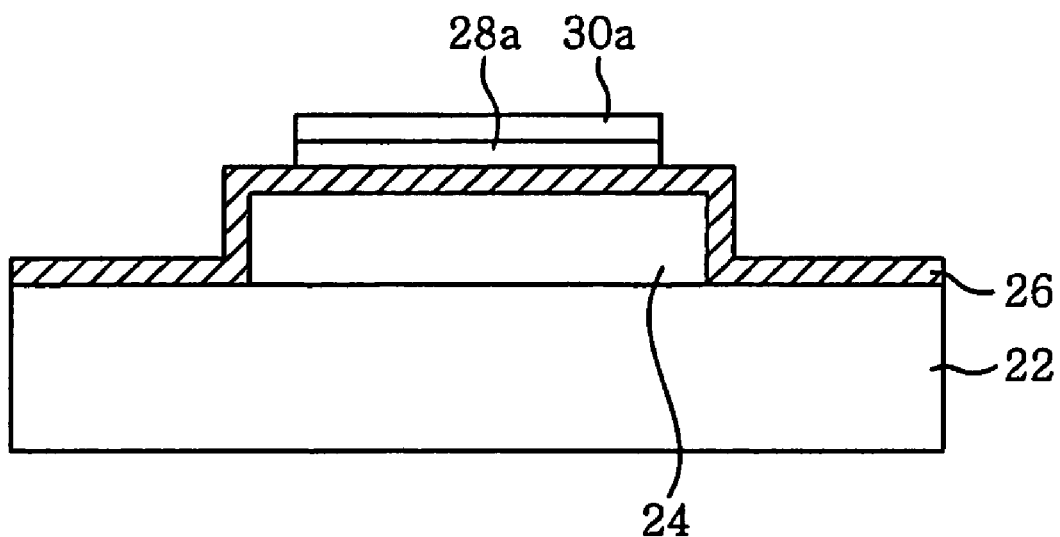

As shown in FIG. 3F, the nitride layer 28 is etched through a dry etching process by using the second photoresist layer pattern 34 as a mask, thereby forming the nitride layer pattern 28a. At this time, since the nitride layer 28 is etched by using a dry etching process, polymers would be generated at both sides of the nitride layer pattern 28. Therefore, as shown in FIG. 3G, it is preferable that the polymers 29 generated at both sides of nitride layer pattern 28a are removed by performing a Descum process. In this regard, the Descum process is performed at a temperature of 120° C. for 20 seconds by using $O_2$ and $N_2/H_2$ gas.

Figure 3H:
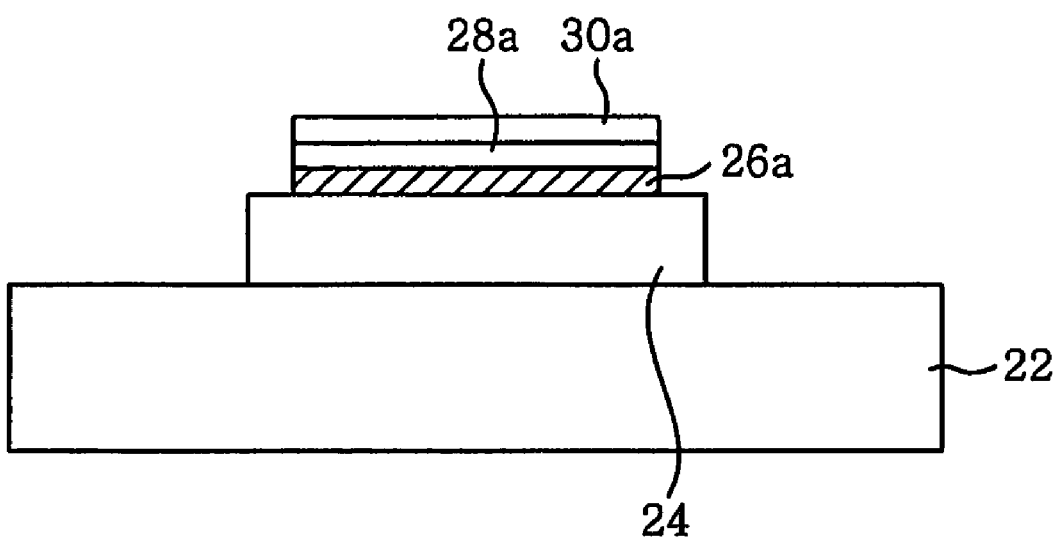

Finally, as shown in FIG. 3H, the first oxide layer pattern 26a is formed by etching the first oxide layer 26 through a wet etching process.

Figure 4A:
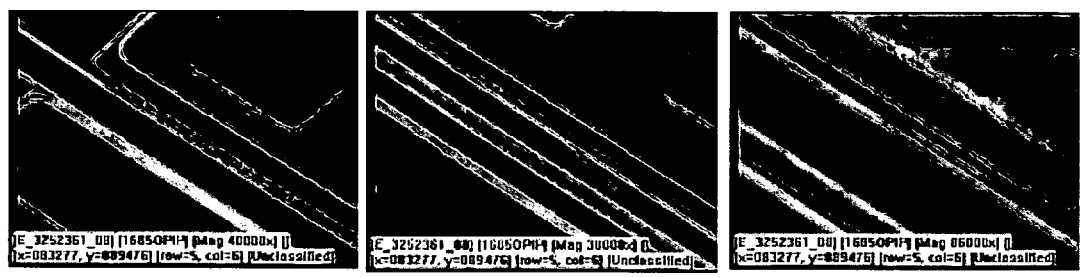
FIGS. 4A and 4B illustrate photographs comparing polymers generated at the semiconductor device manufactured by a prior art with polymers generated at the semiconductor device manufactured by the present invention, respectively.
Figure 4B:
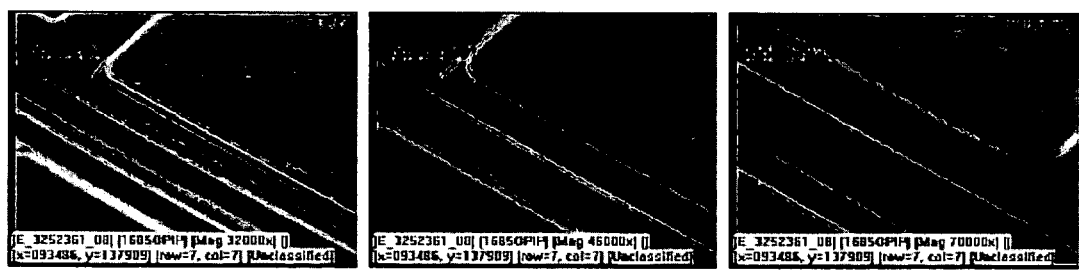

FIG. 4A and FIG. 4B represent photographs of a semiconductor device manufactured according to the prior art and a semiconductor device manufactured in accordance with the present invention, respectively. As seen from the photographs, it is observed that the semiconductor device manufactured in accordance with the present invention has few polymers.

Although the invention has been shown and described with respect to the preferred embodiment, it will be understood by those skilled in the art that various changes and modifications may be made without departing from the spirit and scope of the invention.

For example, in this embodiment, it has been is described that the second oxide layer 30 is etched by using a wet etching process, while the nitride layer 28 is etched by using a dry etching process. Alternatively, both the second oxide layer 30 and the nitride layer 28 can be etched through a dry etching. In this regard, to remove the polymers generated from the process of forming the second oxide layer pattern 30a, a Descum process may be performed after forming the second oxide layer pattern 30a and all polymers can be removed by performing the Descum process once, after forming the nitride layer pattern 28a.

In still another embodiment, both the second oxide layer 30 and the nitride layer 28 may be etched by using a wet etching process. To ensure the designed exact CD, it is preferable that an additional photoresist layer pattern is formed on the nitride layer pattern 28a after the step of forming the nitride layer pattern 28a, and that the first oxide layer 26 is etched by using the third photoresist layer pattern as a mask.

In still further another embodiment, the second oxide layer 30 can be etched by using a dry etching process and the nitride layer 28 may be etched by using a wet etching process. In this regard, the polymers generated due to the formation of the second oxide layer pattern 30a are removed by applying a Descum process. Also, since the nitride layer 28 is etched by using a wet etching process, to ensure formation with the designed exact CD, it is preferable that the third photoresist layer pattern is formed on the nitride layer pattern 28a after the step of forming the nitride layer pattern 28a. The first oxide layer 26 is then etched by using the third photoresist layer as a mask.

In accordance with the present invention described above, it is possible to remove polymers generated at processes of etching the oxide layer and the nitride layer, thereby having an effect to realize a desired CD.

Also, since polymers are removed beforehand, there is an effect that a semiconductor manufacturing device can be prevented from being contaminated by also preventing the polymers generated due to the following heating process from lifting.

While the invention has been shown and described with respect to the preferred embodiments, it will be understood by those skilled in the art that various changes and modifications may be made without departing from the spirit and scope of the invention as defined in the following claims.

What is claimed is:

1. A method for manufacturing a semiconductor device, the method comprising the steps of:
   forming a gate on a semiconductor substrate;
   sequentially stacking a first oxide layer, a nitride layer and a second oxide layer on the semiconductor substrate, including the gate;
   forming a first photoresist layer pattern on the second oxide layer;
   forming a second oxide layer pattern by wet etching the second oxide layer, using the first photoresist layer pattern as a mask;
   forming a nitride layer pattern by dry etching the nitride layer, using the second oxide layer pattern as a mask; and
   forming a first oxide layer pattern by etching the first oxide layer by using the nitride layer pattern as a mask;
   wherein before the step of forming the first oxide layer pattern, the method comprises removing polymers generated on at least one side of the nitride layer pattern by performing a Descum process.

2. The method of claim 1, wherein before the step of forming the nitride layer pattern, the method further comprises:
   forming a second photoresist layer pattern for forming the nitride layer pattern on the second oxide layer pattern, wherein the nitride layer is etched by using the second photoresist layer pattern as a mask.

3. The method of claim 1, wherein the Descum process is performed by using $O_2$ and $N_2/H_2$ gas.

4. The method of claim 1, wherein the Descum process is performed at a temperature of 120° C. for 20 seconds.

5. The method of claim 1, wherein the first oxide layer pattern is formed by wet etching the first oxide layer.

6. A method for manufacturing a semiconductor device, the method comprising the steps of:
   forming a gate on a semiconductor substrate;

sequentially stacking a first oxide layer, a nitride layer and a second oxide layer on the semiconductor substrate, including the gate;

forming a first photoresist layer pattern on the second oxide layer;

forming a second oxide layer pattern by selectively etching the second oxide layer using the first photoresist layer pattern as a mask and removing the first photoresist layer pattern;

forming a nitride layer pattern by wet etching the nitride layer, using the second oxide layer pattern as a mask; and forming a first oxide layer pattern by selectively etching the first oxide layer, using the nitride layer pattern as a mask.

7. The method of claim 6, wherein before the step of forming the first oxide layer pattern, the method further comprises:

forming a second photoresist layer pattern on the nitride layer pattern for forming the first oxide layer pattern, wherein the first oxide layer is etched using the second photoresist layer pattern as a mask.

8. The method of claim 6, wherein the second oxide layer pattern is formed by dry etching the second oxide layer.

9. The method of claim 8, wherein before the step of forming the nitride layer pattern, the method further comprises:

removing polymers generated on at least one side of the second oxide layer pattern by performing a Descum process.

10. The method of claim 9, wherein the Descum process is performed by using $O_2$ and $N_2/H_2$ gas.

11. The method of claim 9, wherein the Descum process is performed at a temperature of 120° C. for 20 seconds.

12. The method of claim 6, wherein the second oxide layer pattern is formed by wet etching the second oxide layer.

13. The method of claim 12, wherein before the step of forming the nitride layer pattern, the method further comprises:

forming a second photoresist layer pattern for forming the nitride layer pattern on the second oxide layer pattern, wherein the nitride layer is etched by using the second photoresist layer pattern as a mask.

14. The method of claim 6, wherein the first oxide layer pattern is formed by wet etching the first oxide layer.

* * * * *